United States Patent
Chen et al.

(10) Patent No.: US 10,424,479 B2
(45) Date of Patent: *Sep. 24, 2019

(54) METHOD FOR MAKING NANO-SCALED CHANNELS WITH NANOWIRES AS MASKS

(71) Applicants: Tsinghua University, Beijing (CN); HON HAI PRECISION INDUSTRY CO., LTD., New Taipei (TW)

(72) Inventors: Mo Chen, Beijing (CN); Qun-Qing Li, Beijing (CN); Li-Hui Zhang, Beijing (CN); Xiao-Yang Xiao, Beijing (CN); Jin Zhang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/851,903

(22) Filed: Dec. 22, 2017

(65) Prior Publication Data

US 2018/0301340 A1    Oct. 18, 2018

(30) Foreign Application Priority Data

Apr. 13, 2017  (CN) .......................... 2017 1 0239765

(51) Int. Cl.
*H01L 21/027*     (2006.01)
*H01L 21/285*     (2006.01)
(Continued)

(52) U.S. Cl.
CPC ...... *H01L 21/0272* (2013.01); *H01L 21/0332* (2013.01); *H01L 21/0337* (2013.01);
(Continued)

(58) Field of Classification Search
CPC ..... H01L 29/0665–068; H01L 51/0016; H01L 21/0272; H01L 21/0331; H01L 21/7813;
(Continued)

(56) References Cited

U.S. PATENT DOCUMENTS

| | | |
|---|---|---|
| 2011/0108804 A1 | 5/2011 | Bangsaruntip et al. |
| 2013/0140269 A1 | 6/2013 | Chiang et al. |
| 2016/0340233 A1* | 11/2016 | Jin .......................... C03C 17/09 |

FOREIGN PATENT DOCUMENTS

| | | |
|---|---|---|
| TW | 201101487 A1 | 1/2011 |
| TW | 201324608 A1 | 6/2013 |

* cited by examiner

*Primary Examiner* — Laura M Menz
*Assistant Examiner* — Candice Chan
(74) *Attorney, Agent, or Firm* — ScienBiziP, P.C.

(57) ABSTRACT

A method of making nano-scaled channel, the method including: locating a first photoresist layer, a nanowire structure, and a second photoresist layer on a surface of a substrate, and the nanowire structure being sandwiched between the first photoresist layer and the second photoresist layer, wherein the nanowire structure comprises an nanowire; forming an opening in the first photoresist layer and the second photoresist layer to expose a portion of the surface of the substrate to form an exposed surface, wherein a part of the nanowire is exposed and suspended in the opening, and both ends of the nanowire are sandwiched between the first photoresist layer and the second photoresist layer; and depositing a thin film layer on the exposed surface of the substrate using the a nanowire as a mask, wherein the thin film layer defines a nano-scaled channel corresponding to the at least one nanowire.

13 Claims, 13 Drawing Sheets

(51) Int. Cl.
*H01L 29/417* (2006.01)
*H01L 21/033* (2006.01)
*H01L 29/786* (2006.01)
*H01L 21/32* (2006.01)

(52) U.S. Cl.
CPC .......... *H01L 21/2855* (2013.01); *H01L 21/32* (2013.01); *H01L 29/41733* (2013.01); *H01L 29/78696* (2013.01)

(58) Field of Classification Search
CPC ........................ H01L 2224/0347–0348; H01L 2224/1147–1148; H01L 2224/2747–2748; H01L 21/027–0338; H01L 21/32; H01L 21/0271–0279; H01L 21/312–3128; H01L 21/02603; H01L 21/0425–044; H01L 21/048–0495; H01L 21/12; H01L 21/28–2885; H01L 21/401; H01L 21/44–449; H01L 29/41725–41791; H01L 29/7839; H01L 29/806; Y10S 977/762–772; C01P 2002/10

See application file for complete search history.

US 10,424,479 B2

METHOD FOR MAKING NANO-SCALED CHANNELS WITH NANOWIRES AS MASKS

CROSS-REFERENCE TO RELATED APPLICATIONS

This application claims all benefits accruing under 35 U.S.C. § 119 from China Patent Application No. 201710239765.4, filed on Apr. 13, 2017, in the China Intellectual Property Office, the disclosure of which is incorporated herein by reference.

FIELD

The subject matter herein generally relates to a method for making nano-scaled channels.

BACKGROUND

At present in preparation of nanostructures, the minimum processing size is mainly determined by the performance of the processing devices. And some critical dimensions, especially sub-10 nanometers, has exceeded the limits of the majority of processing devices. Even if the critical dimensions can be obtained by processing devices, it is not easy to control cost and yield.

Methods for making small dimension structures include evaporation stripping method and etching method. These methods require small-sized patterned photoresist layers as a mask to prepare small dimension structures such as fine groove structures. However, it is difficult to obtain the small-sized photoresist layers. If the photoresist layer is too thick, it is difficult to stand up and easy to collapse. If the photoresist layer is too thin, it is difficult to transfer the photoresist layer. Also when the photoresist is removed by peeling or etching, the photoresist has a small amount of residue which cause the small dimension structures to be inaccurate.

What is needed, therefore, is to provide a method for making nano-scaled channels for solving the problem discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will now be described, by way of example only, with reference to the attached figures, wherein.

DETAILED DESCRIPTION

Figure 1:
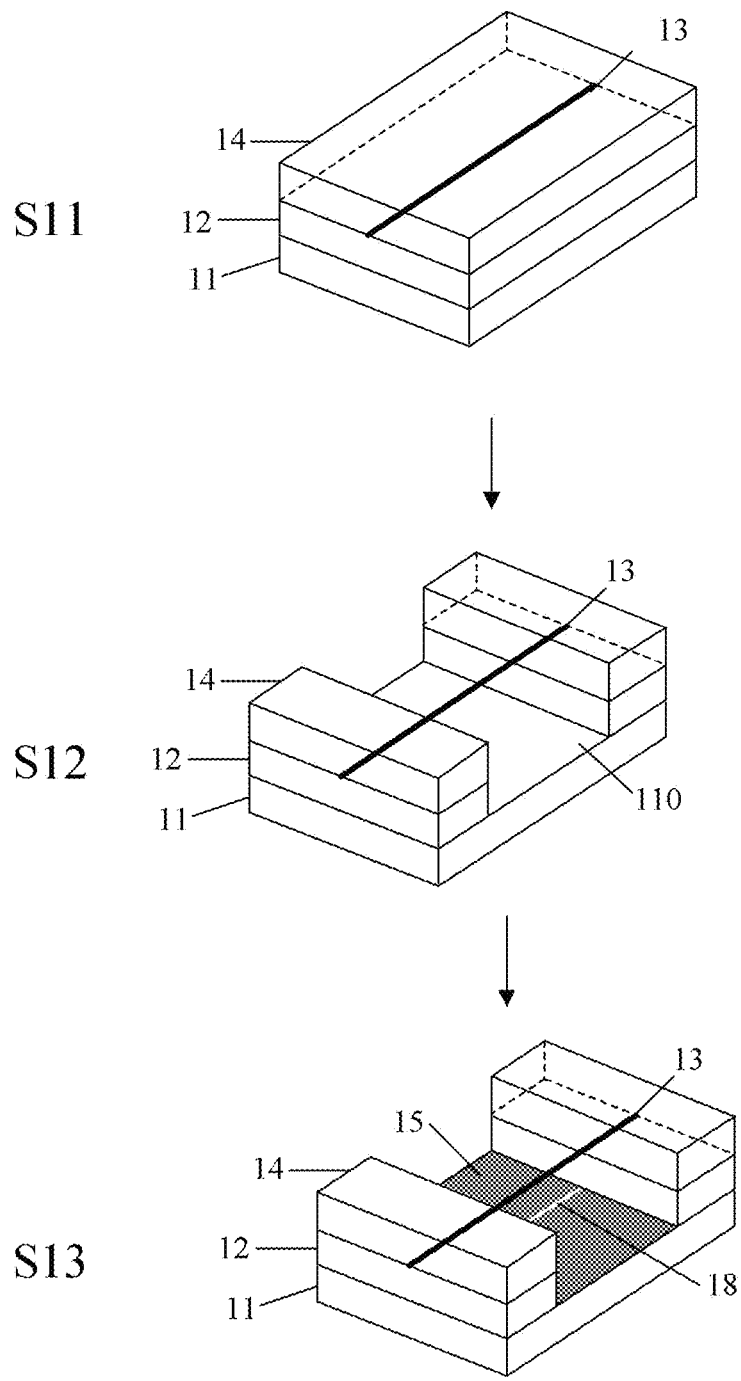
FIG. 1 is a flow chart of one embodiment of a method for making nano-scaled channels.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Referring to FIG. 1, an embodiment of a method of making nano-scaled channels 18 comprises:

S11, providing a substrate 11, locating a first photoresist layer 12, a carbon nanotube structure 13, and a second photoresist layer 14 on a surface of the substrate 11, and the carbon nanotube structure 13 being sandwiched between the first photoresist layer 12 and the second photoresist layer 14, wherein the carbon nanotube structure 13 comprises at least one carbon nanotube wire;

S12, forming at least one opening in the first photoresist layer 12 and the second photoresist layer 14 to expose a portion of the surface of the substrate 11 to form an exposed surface, wherein a part of the carbon nanotube wire is exposed and suspended in the opening, and both ends of the carbon nanotube wire are sandwiched between the first photoresist layer 12 and the second photoresist layer 14; and S13, depositing a thin film layer 15 on the exposed surface of the substrate 11 using the carbon nanotube structure 13 as a mask, wherein the thin film layer 15 defines nano-scaled channels 18 corresponding to the carbon nanotube wire.

In step S11, the material of the substrate 11 can be insulating materials such as silica or silicon nitride. The material of the substrate 11 can also be conductive materials such as gold, aluminum, nickel, chromium, or copper. Also the material of the substrate 11 can be semiconductor materials such as silicon, gallium nitride, or gallium arsenide. In one exemplary embodiment, the material of the substrate 11 is a silicon wafer.

The type of the first photoresist layer 12 and the second photoresist layer 14 can be negative or positive. The type of the first photoresist layer 12 and the second photoresist layer 14 are the same. The first photoresist layer 12 and the second photoresist layer 14 can be electron beam photoresist layer or ultraviolet photoresist layer. In one exemplary embodiment, the first photoresist layer 12 and the second photoresist layer 14 are electron beam photoresist layers. The materials of the first photoresist layer 12 and the second photoresist layer 14 can be poly methyl methacrylate (PMMA), ZEP. The thickness of the first photoresist layer 12 can be in a range from 50 nm to 400 nm. The thickness of the second photoresist layer 14 can be in a range from 50 nm to 300 nm. The thickness of the first photoresist layer 12 can be in a range from 100 nm to 350 nm. The thickness of the second photoresist layer 14 can be in a range from 100 nm to 250 nm. In one exemplary embodiment, the material of the first photoresist layer 12 is ZEP 520A, the thickness of the first photoresist layer 12 is 320 nm; the material of the second photoresist layer 14 is PMMA 950A4, the thickness of the second photoresist layer 14 is 220 nm.

The carbon nanotube structure 13 includes at least a carbon nanotube wire. The carbon nanotube structure 13 can include a single carbon nanotube wire or a plurality of carbon nanotube wires. When the carbon nanotube structure 13 includes a plurality of carbon nanotube wires, the plurality of carbon nanotube wires can extend along a same direction, the plurality of carbon nanotube wires can be crossed to form a network structure. When the plurality of carbon nanotube wires are parallel with each other, a distance between two adjacent carbon nanotubes is greater than or equal to 50 nanometers. In one exemplary embodiment, the distance between two adjacent carbon nanotubes is greater than or equal to 100 nanometers. The carbon nanotube wires are formed by long single-walled carbon nanotubes. The diameter of the single-walled carbon nanotubes can be from about 0.5 nanometers to about 2 nanometers. The length of the single-walled carbon nanotubes can be greater than or equal to 1 micrometer. The length of the single-walled carbon nanotubes can be greater than 20 micrometers. The single-walled carbon nanotubes can be made by chemical vapor deposition. In one exemplary embodiment, the carbon nanotube structure 13 comprises a plurality of carbon nanotubes wires parallel with each other, and the distance between two adjacent carbon nanotubes wire is 1 micrometer. Each carbon nanotube wire includes a single-walled carbon nanotube, and the diameter of the single-walled carbon nanotube is 1 nanometer, the length of the single-walled carbon nanotube is 50 micrometers.

The carbon nanotube structure 13 can be replaced by other nanowire structures as long as the diameter of the nanowire is in nano-scaled. The nanowire structures can be metal nanowires such as nickel nanowires, platinum nanowires, gold nanowires. The nanowire structures can be semiconductor nanowires such as indium phosphide nanowires, silicon nanowires, gallium nitride nanowires. The nanowire structures can be insulator nanowires such as silicon dioxide nanowires, titanium dioxide nanowires. The methods for making the nanowire structures can be conventional methods.

The method of locating a first photoresist layer 12, a carbon nanotube structure 13, a second photoresist layer 14 on a surface of the substrate 11 can be achieved through the following methods. First method, the first photoresist layer 12, the carbon nanotube structure 13, the second photoresist layer 14 are deposited on the surface of the substrate 11 in sequence. Second method, the first photoresist layer 12 is deposited on the surface of the substrate 11 firstly; then the carbon nanotube structure 13 and the second photoresist layer 14 are provided on the surface of the first photoresist layer 12 together. Third method, the first photoresist layer 12 and the carbon nanotube structure 13 are applied on the surface of the substrate 11 together; then the second photoresist layer 14 is provided on the carbon nanotube structure 13. Fourth method, the first photoresist layer 12 and a carbon nanotube structure unit 131 are located on the surface of the substrate 11 together; then another carbon nanotube structure unit 132 and the second photoresist layer 14 are provided on the carbon nanotube structure unit 131, and the carbon nanotube structure unit 131 and the carbon nanotube structure unit 132 are contacted and form the carbon nanotube structure 13.

Figure 2:
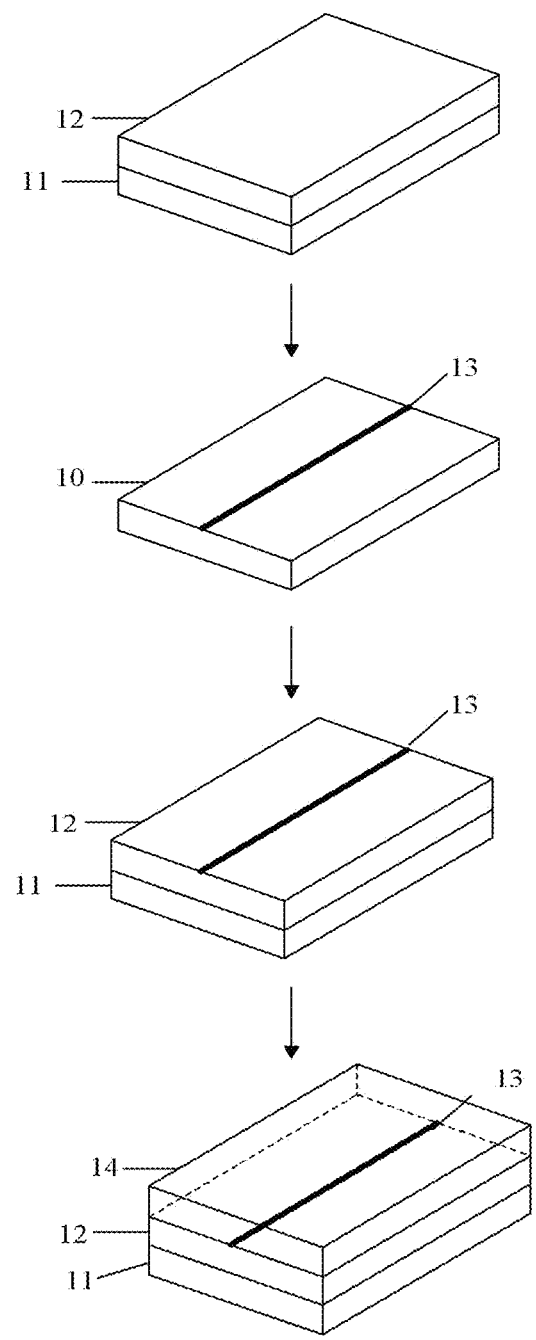
FIG. 2 is a flow chart of one embodiment of a first method for stacking a first photoresist layer, a carbon nanotube structure, and a second photoresist layer.

Referring to FIG. 2, the first method comprises following steps: firstly, coating the first photoresist layer 12 on the surface of the substrate 11 by spin coating method; secondly, growing the carbon nanotube structure 13 on a growth substrate 10; thirdly, transferring the carbon nanotube structure 13 from the growth substrate 10 to the first photoresist layer 12; fourthly, coating the second photoresist layer 14 on the first photoresist layer 12, wherein the second photoresist layer 14 covers the carbon nanotube structure 13 so that the carbon nanotube structure 13 is sandwiched between the first photoresist layer 12 and the second photoresist layer 14.

Figure 3:
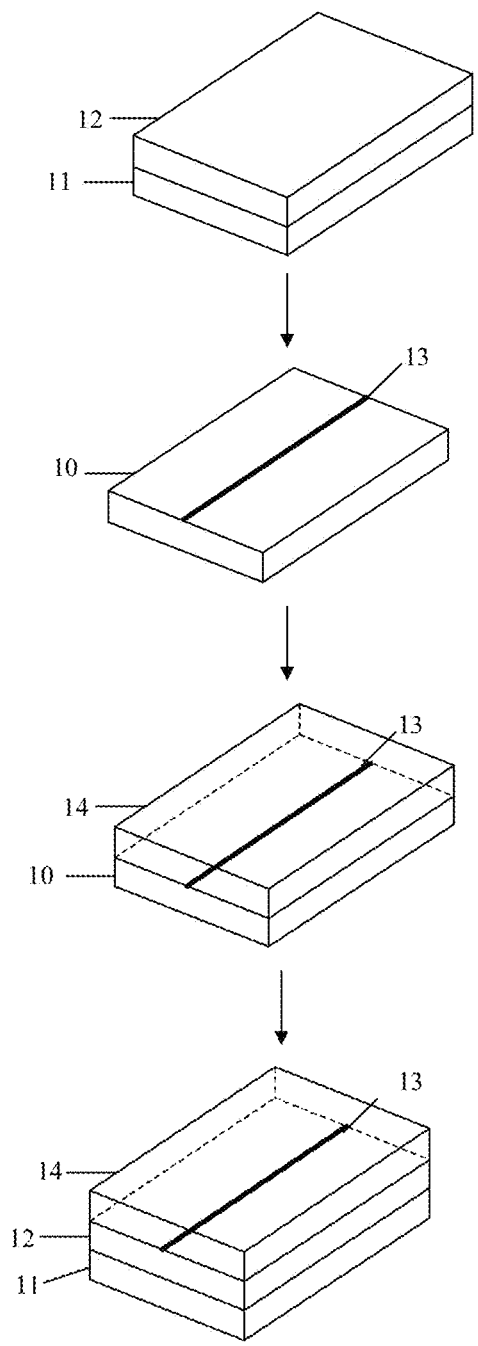
FIG. 3 is a flow chart of one embodiment of a second method for stacking a first photoresist layer, a carbon nanotube structure, and a second photoresist layer.

Referring to FIG. 3, the second method comprises following steps: firstly, coating the first photoresist layer 12 on the surface of the substrate 11; secondly, growing the carbon nanotube structure 13 on the growth substrate 10; thirdly, coating the second photoresist layer 14 on the growth substrate 10, wherein the second photoresist layer 14 covers the carbon nanotube structure 13; fourthly, separating the carbon nanotube structure 13 and the second photoresist layer 14 from the growth substrate 10, and the carbon nanotube structure 13 and the second photoresist layer 14 being provided on the surface of the first photoresist layer 12 together, wherein the carbon nanotube structure 13 is sandwiched between the first photoresist layer 12 and the second photoresist layer 14. When the carbon nanotube structure 13 and the second photoresist layer 14 are separated from the growth substrate 10, the carbon nanotube structure 13 is bonded or adsorbed on the second photoresist layer 14.

Figure 4:
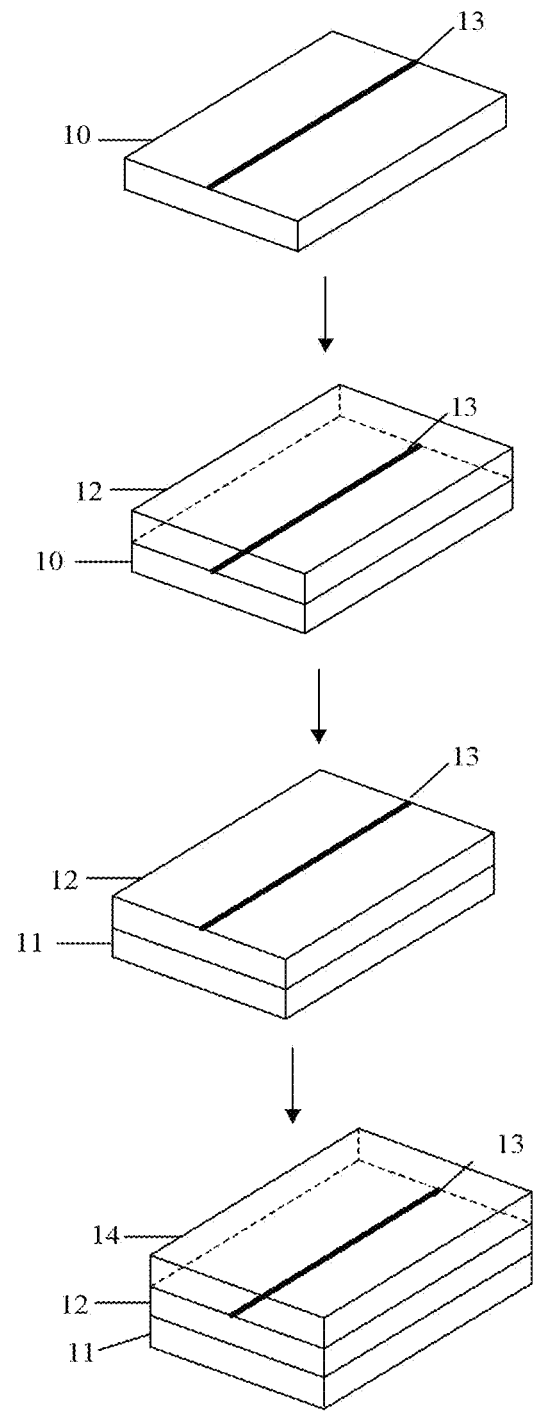
FIG. 4 is a flow chart of one embodiment of a third method for stacking a first photoresist layer, a carbon nanotube structure, and a second photoresist layer.

Referring to FIG. 4, the third method comprises following steps: firstly, growing the carbon nanotube structure 13 on the growth substrate 10; secondly, coating the first photoresist layer 12 on the growth substrate 10 wherein the first photoresist layer 12 covers the carbon nanotube structure 13; thirdly, separating the carbon nanotube structure 13 and the first photoresist layer 12 from the growth substrate 10, and providing the carbon nanotube structure 13 and the first photoresist layer 12 together on the surface of the substrate 11, wherein the first photoresist layer 12 is sandwiched between the substrate 11 and the carbon nanotube structure 13; fourthly, coating the second photoresist layer 14 on the carbon nanotube structure 13.

Figure 5:
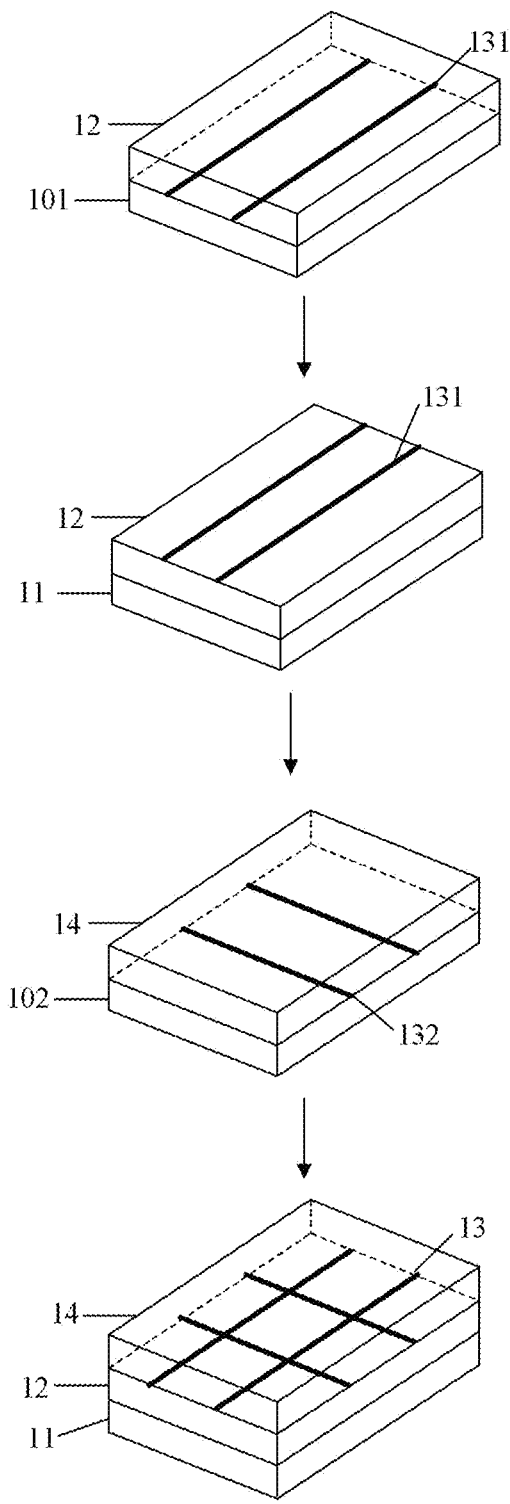
FIG. 5 is a flow chart of one embodiment of a fourth method for stacking a first photoresist layer, a carbon nanotube structure, and a second photoresist layer.

Referring to FIG. 5, the fourth method comprises following steps: firstly, growing the first carbon nanotube structure unit 131 on a first growth substrate 101, and spin coating the first photoresist layer 12 on the first growth substrate 101 to cover the first carbon nanotube structure unit 131; secondly, separating the first carbon nanotube structure unit 131 and the first photoresist layer 12 from the first growth substrate 101, and placing the first carbon nanotube structure unit 131 and the first photoresist layer 12 together on the surface of the substrate 11, wherein the first photoresist layer 12 is sandwiched between the substrate 11 and the first carbon nanotube structure unit 131; thirdly, coating the second carbon nanotube structure unit 132 on a second growth substrate 102, and spin coating the second photoresist layer 14 on the second growth substrate 102 to cover the second carbon nanotube structure unit 132; fourthly, separating the second carbon nanotube structure unit 132 and the second photoresist layer 14 from the second growth substrate 102, and placing the second carbon nanotube structure unit 132 and the second photoresist layer 14 together on the first carbon nanotube structure unit 131, wherein the first carbon nanotube structure unit 131 and the second carbon nanotube structure unit 132 are contacted and form the carbon nanotube structure 13.

Each of the carbon nanotube structure units 131 and 132 can comprise a plurality of parallel carbon nanotube wires. An extension direction of carbon nanotube wires in the carbon nanotube structure units 132 can be intersected with an extension direction of carbon nanotube wires in the carbon nanotube structure units 131 so that the carbon nanotube structure 13 form a network structure.

In step S12, the method for forming the opening can comprise following steps: firstly, selecting a pattern on the surface of the second photoresist layer 14; secondly, exposing the first photoresist layer 12 and the second photoresist layer 14 corresponding to the pattern with electron beam; thirdly, developing and removing the exposed photoresist to obtain the opening. After removal of the exposed photoresist, the surface of the substrate 11 corresponding to the opening is exposed. According to the size of area of the second photoresist layer 14, one opening or more openings spaced with each other can be formed in the first photoresist layer 12 and the second photoresist layer 14. The surface of the substrate 11 corresponding to each opening is exposed, and a part of the carbon nanotube structure 13 corresponding to each opening is suspended. The shapes of openings can be designed by selecting the pattern. For example, the openings can be stripe openings, circular openings, polygonal openings. In one exemplary embodiment, a plurality of spaced and parallel strip openings are formed in the photoresist layers, the width of each strip opening is 300 nanometers.

When the first photoresist layer 12 and the second photoresist layer 14 is exposed, the intensity of exposure beam is selected according to the material and thickness of the photoresist layers. The process of exposing the first photoresist layer 12 and the second photoresist layer 14 comprises: vertically irradiating the pattern of the second photoresist layer 14 with a beam, wherein the beam can pass through the second photoresist layer 14 and irradiate the first photoresist layer 12. The exposure area of the first photoresist layer 12 is same as the exposure area of the second photoresist layer 14. The beam can be electron beam.

Figure 6:
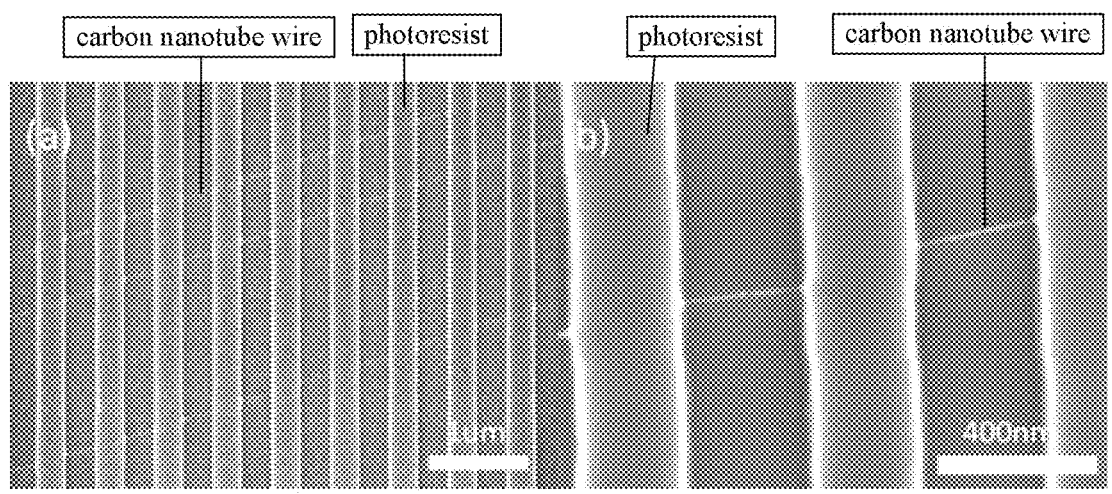
FIG. 6 shows Scanning Electron Microscope (SEM) images of carbon nanotube wires exposed by exposure.

The method for developing and removing the photoresist includes: placing the first photoresist layer 12 and the second photoresist layer 14 in a developer for a period of time. The developer is a mixed solution of amyl acetate, and the developing time is 90 s. The developer is not limited above as long as the exposed photoresist can be developed. The developing time can be determined by the concentration and component of the developer. The opening can be obtained by removing the exposed photoresist. Since the carbon nanotube structure 13 is not affected by development, the carbon nanotube wires corresponding to the openings are exposed. Referring to FIG. 6, FIG. 6a is a SEM image of carbon nanotube wires exposed by exposure; FIG. 6b is a partial enlarged image of FIG. 6a. Since both ends of the exposed carbon nanotube wires are still sandwiched between the first photoresist layer 12 and the second photoresist layer 14, the exposed carbon nanotube wires are suspended above the substrate 11. The method further comprises fixing the exposed photoresist with a fixing solution, and the fixing time is 30 s.

In step S13, the material of the thin film layer 15 can be metal materials such as gold, nickel, titanium, iron, aluminum. The material of the thin film layer 15 can also be nonmetallic materials such as alumina, magnesium oxide, zinc oxide, hafnium oxide, and silica. The material of the thin film layer 15 is not limited above as long as the material can form a film. The thin film layer 15 can be deposited by magnetron sputtering, electron beam evaporation, or the like. The thickness of the thin film layer 15 should be lower than the thickness of the first photoresist layer 12, so that the carbon nanotube wires can always be suspended above the thin film layer 15 and not contact with the thin film layer 15, also the carbon nanotube wires are not wrapped by the thin film layer 15. If the thin film layer 15 is too thick, the time of depositing the thin film layer 15 becomes longer, and the material deposited on the surface of the suspended carbon nanotube wires would easily crushes the carbon nanotube wires.

During the process of depositing the thin film layer 15, the suspended carbon nanotubes as a mask can be coated with the film material, so that the surface of the substrate 11 corresponding to the mask cannot be coated with the film material, and other parts of the surface of the substrate can be coated with the film material. The part of the substrate surface, without film material deposited thereon, is defined as first region, and the shape and size of the first region are same as or similar to the shape and size of the carbon nanotube wires. A channel 18 is formed at the first region.

Figure 7:
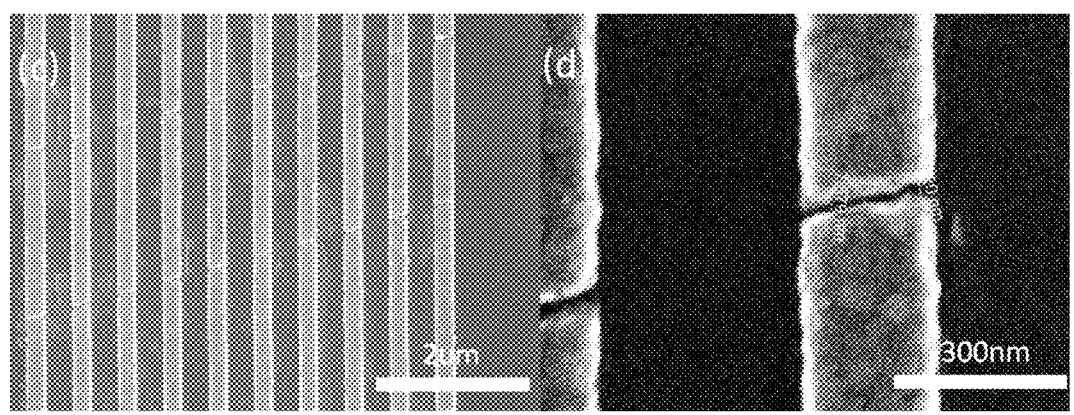
FIG. 7 shows SEM images of nano-scaled channels.

However, the direction of depositing the film material is not strictly perpendicular to the substrate surface 110 during actual deposition process, and there is a small deviation between the deposition direction and the vertical direction, so the width of the channel cannot be exactly same as the diameter of the carbon nanotube wire. For example, when the deposited material is deposited by a point-like evaporation source, there is a deviation between the deposition direction and the vertical direction, so the width of the channel is slightly greater than the diameter of the carbon nanotube wire. In addition, during removing the exposed photoresist, a small amount of the exposed photoresist may remain on the surface of the carbon nanotube wires, so the diameter of the mask can be slightly greater than the diameter of the carbon nanotube wires, and the width of the channel can be slightly greater than the diameter of the carbon nanotube wire. Although the width of the channel can be greater than the diameter of the carbon nanotube wires due to the deviation, the width of the channel can still be in nano-scaled. The channel becomes smaller as the diameter of the carbon nanotube wires becomes smaller. Since the carbon nanotube wire is composed of single-walled carbon nanotubes, the diameter of the single-walled carbon nanotubes is in nano-scaled, so that the width of the channel is also in nano-scaled. In one exemplary embodiment, the width of the channel 18 can be in a range from about 5 nanometers to about 10 nanometers. Referring to FIG. 7, FIG. 7(c)-(d) are Scanning Electron Microscope (SEM) images of nano-scaled channels 18. As can be seen from the FIG. 7, the width of the channels is in nano-scaled. In one exemplary embodiment, the width of the channel 18 is 7.5 nanometers.

After obtaining the channels 18, the method further includes a step of removing the first photoresist layer 12, the second photoresist layer 14, and the carbon nanotube structure 13, so that the channels 18 can be used to make electric device such as a thin film transistor (TFT). For example, the structure obtained in step S13 can be placed in a photoresist removal solution. The photoresist removal solution can be acetone solution or butanone solution. In one exemplary embodiment, the first photoresist layer 12 and the second photoresist layer 14 are removed by the butanone solution. Since the carbon nanotube structure 13 is sandwiched between the first photoresist layer 12 and the second photoresist layer 14, the carbon nanotube structure 13 can also be removed together. Only the thin film layer 15 is located on the surface of the substrate 11, and the channels 18 are formed on the thin film layer 15.

The advantages of the method of making nano-scaled channels are described below. Since the carbon nanotube wires are used as a mask, the morphology of the carbon nanotube wires can be transferred to the thin film layer 15, and nano-scaled channels are obtained. The width of the channels can be controlled by selecting the diameter of the carbon nanotubes wires. The carbon nanotube wires are not in contact with the thin film layer 15, so that the carbon nanotube wires can be easily removed. After removing the carbon nanotube wires, the pattern of the thin film layer 15 would not be damaged. The substrate and deposited material are not limited by using the method, and the method is simple and easy to be performed.

Figure 8:
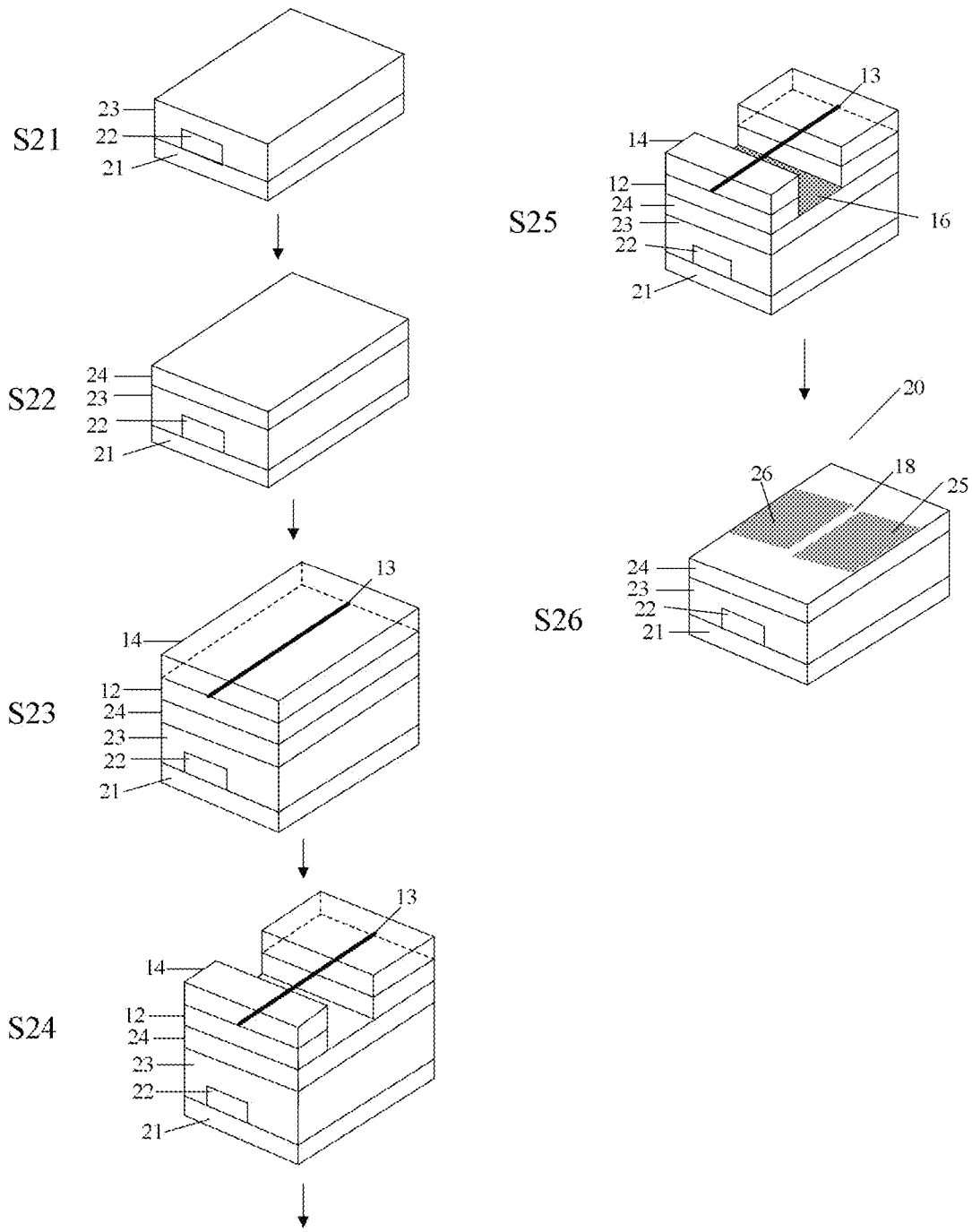
FIG. 8 is a flow chart of one embodiment of a method for making a thin film transistor having nano-scaled channels.

Referring to FIG. 8, an embodiment of a method of making a thin film transistor 20 with nano-scaled channels 18 comprises:

S21, providing a gate electrode 22 on a substrate 21, forming a gate insulating layer 23 on a surface of the gate electrode 22;

S22, placing a semiconductor layer 24 on the gate insulating layer 23;

S23, locating a first photoresist layer 12, a carbon nanotube structure 13, a second photoresist layer 14 on a surface of the semiconductor layer 24, and the carbon nanotube structure 13 being sandwiched between the first photoresist layer 12 and the second photoresist layer 14, wherein the carbon nanotube structure 13 comprises at least one carbon nanotube wire;

S24, forming at least one opening in the first photoresist layer 12 and the second photoresist layer 14 to expose a portion of the surface of the semiconductor layer 24 to form an exposed surface, wherein a part of the carbon nanotube wire is exposed and suspended in the opening, and both ends of the carbon nanotube wire are sandwiched between the first photoresist layer 12 and the second photoresist layer 14;

S25, depositing a conductive film layer 16 on the exposed surface of the semiconductor layer 24 using the carbon nanotube structure 13 as a mask, wherein the conductive film layer 16 defines a nano-scaled channel 18 corresponding to the carbon nanotube wire, and the conductive film layer 16 is divided into two regions by the nano-scaled channel 18, one region is used as a source electrode 25, and the other region is used as a drain electrode 26;

S26, removing the first photoresist layer 12, the carbon nanotube structure 13, and the second photoresist layer 14.

In step S21, the material of the gate electrode 22 is a conductive material. The conductive material can be metal, indium tin oxide, arsenic trioxide, conductive silver glue, conductive polymers, or conductive carbon nanotubes. The metal materials can be aluminum, copper, tungsten, molybdenum, gold, titanium, palladium or any combination of alloys.

The material of the gate insulating layer 23 can be hard materials such as alumina, hafnium oxide, silicon nitride, or silicon oxide. The material of the gate insulating layer 23 can also be flexible materials such as benzocyclobutene (BCB), polyester, or acrylic resin.

The gate insulating layer 23 can be deposited on the gate electrode 22 by a magnetron sputtering method or a electron beam deposition method. In one exemplary embodiment, the gate insulating layer 23 is deposited by electron beam deposition, and the material of the gate insulating layer 23 is alumina.

In step S22, the material of the semiconductor layer 24 can be gallium arsenide, gallium phosphide, gallium nitride, silicon carbide, germanium silicide, silicon, germanium, carbon nanotubes, graphene, or molybdenum sulfide. The method of forming the semiconductor layer 24 can be tiling method, epitaxial growth method, or vapor deposition method. When the semiconductor layer 24 is a carbon nanotube layer, a graphene layer or a molybdenum sulfide layer, the semiconductor layer 24 can be transferred to the gate insulating layer 23 by a photoresist layer. In one exemplary embodiment, the first photoresist layer 12 is spin-coated on the carbon nanotube layer grown on a growing substrate, then the carbon nanotube layer and the first photoresist layer 12 are transferred to the gate insulating layer 23 together. The carbon nanotube layer is sandwiched between the gate insulating layer 23 and the first photoresist layer 12 and used as the semiconductor layer 24. The thickness of the semiconductor layer 24 can be prepared as desired. The thickness of the semiconductor layer 24 is greater than 5 nanometers. In one exemplary embodiment, the thickness of the semiconductor layer 24 is 10 nanometers.

In steps S23 to S25, the method of making channels is similar to the method of making channels of FIG. 1 except that a conductive film layer 16 is directly deposited on the semiconductor layer 24. The conductive film layer 16 can be directly used as the source electrode 25 and the drain electrode 26, and a thin film transistor 20 having a nano-scaled channel 18 can be obtained by the method.

The step S26 is same as the method of removing the first photoresist layer 12, the carbon nanotube structure 13, and the second photoresist layer 14 above. The thin film transistor 20 can be easily used after removing the photoresist layers and the carbon nanotube structure.

Figure 9:
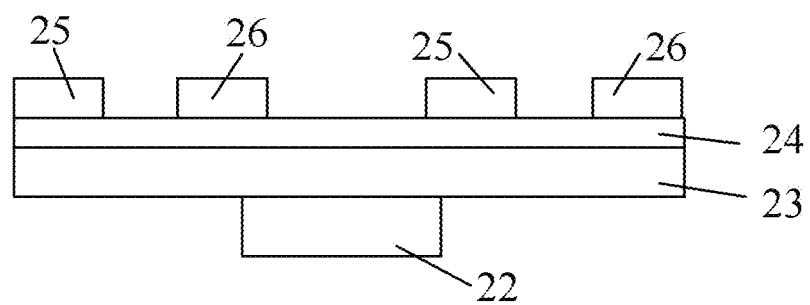
FIG. 9 is a structural schematic view of an arrangement of a plurality of thin film transistors.
Figure 10:
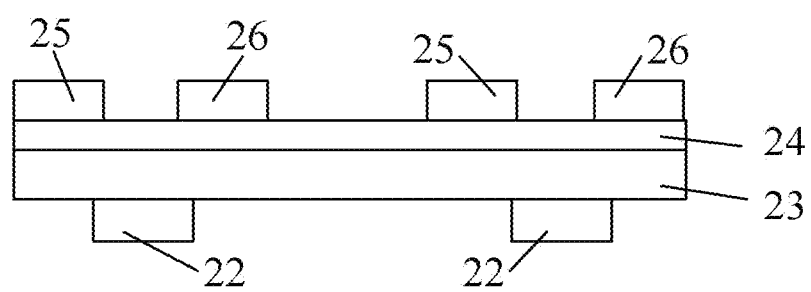
FIG. 10 is a structural schematic view of an arrangement of a plurality of thin film transistors.
Figure 11:
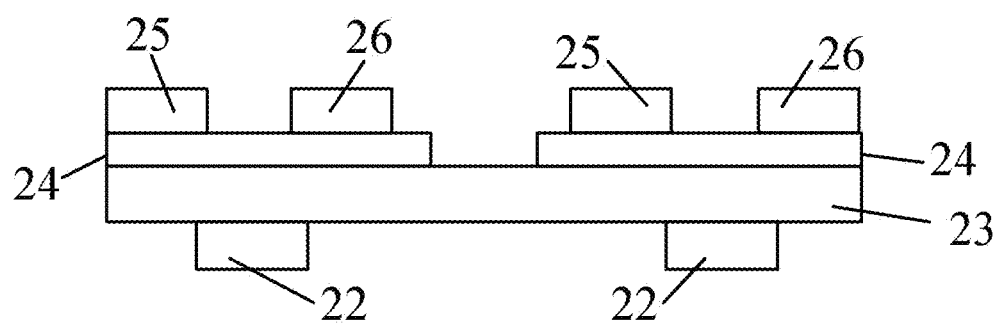
FIG. 11 is a structural schematic view of an arrangement of a plurality of thin film transistors.

Furthermore, a plurality of thin film transistors can be made according to the number and locations of the nano-scaled channels. Each thin film transistors corresponds to one nano-scaled channel and the plurality of thin film transistors are arranged in a pattern array. Referring to FIG. 9, the plurality of thin film transistors can share a common gate electrode. Referring to FIG. 10, each thin film transistor can also have a single gate electrode. The plurality of thin film transistors can share a common semiconductor layer. Each thin film transistor can also have a single semiconductor layer. Referring to FIG. 11, a plurality of gate electrodes are arranged in a pattern array and located on the same substrate, and a common gate insulating layer is located on and cover all the gate electrodes. A plurality of semiconductor layers are located on the gate insulating layer, and the plurality of semiconductor layers are arranged in a pattern array, wherein each semiconductor layer corresponds to a single gate electrode. A plurality of nano-scaled channels are made on surfaces of the plurality of semiconductor layers, and each semiconductor layer corresponds to a nano-scaled channel.

Figure 12:
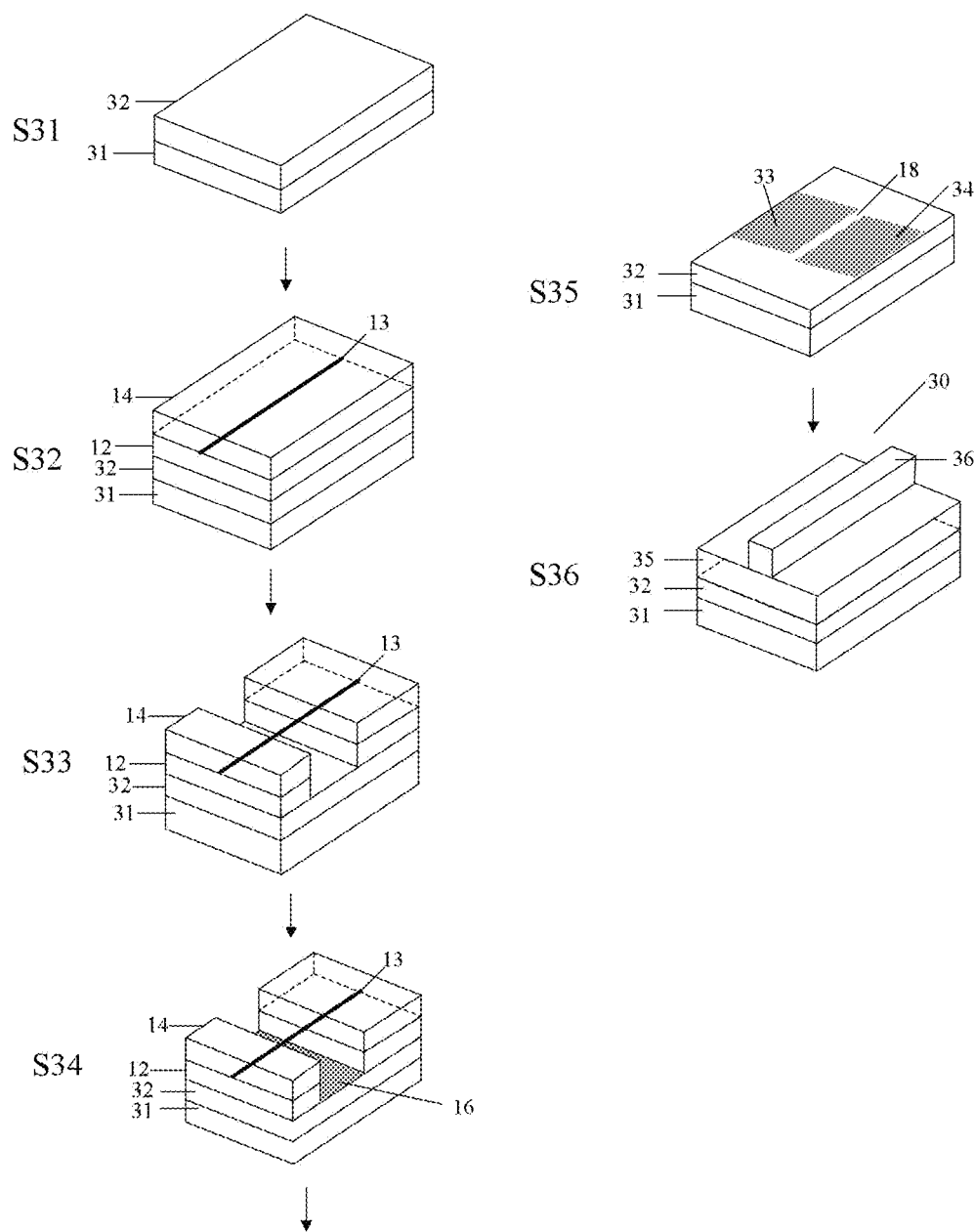
FIG. 12 is a flow chart of one embodiment of a method for making a thin film transistor having nano-scaled channels.

Referring to FIG. 12, an embodiment of a method of making a thin film transistor 30 with a nano-scaled channel 18 comprises:

S31, providing a semiconductor layer 32 on a substrate 31;

S32, locating a first photoresist layer 12, a carbon nanotube structure 13, a second photoresist layer 14 on a surface of the semiconductor layer 32, and the carbon nanotube structure 13 being sandwiched between the first photoresist layer 12 and the second photoresist layer 14, wherein the carbon nanotube structure 13 comprises at least one carbon nanotube wire;

S33, forming at least one opening in the first photoresist layer 12 and the second photoresist layer 14 to expose a portion of the surface of the semiconductor layer 32 to form an exposed surface, wherein a part of the carbon nanotube wire is exposed and suspended in the opening, and both ends of the carbon nanotube wire are sandwiched between the first photoresist layer 12 and the second photoresist layer 14;

S34, depositing a conductive film layer 16 on the exposed surface of the semiconductor layer 32 using the carbon nanotube structure 13 as a mask, wherein the conductive film layer 16 defines a nano-scaled channel 18 corresponding to the carbon nanotube wire, and the conductive film layer 16 is divided into two regions by the nano-scaled channel 18, one region is used as a source electrode 33, and the other region is used as a drain electrode 34;

S35, removing the first photoresist layer 12, the carbon nanotube structure 13, and the second photoresist layer 14;

S36, forming an insulating layer 35 on the semiconductor layer 32 to cover the source electrode 33 and the drain electrode 34, locating a gate electrode 36 on the insulating layer 35.

The method of making thin film transistor 30 is similar to the method of making thin film transistor 20 except that the thin film transistor 30 is a top gate type thin film transistor. The semiconductor layer 32 is provided between the substrate 31 and the source electrode 33, the drain electrode 34. The gate electrode 36 is insulated from the source electrode 33, the drain electrode 34, and the semiconductor layer 32 through the insulating layer 35.

Figure 13:
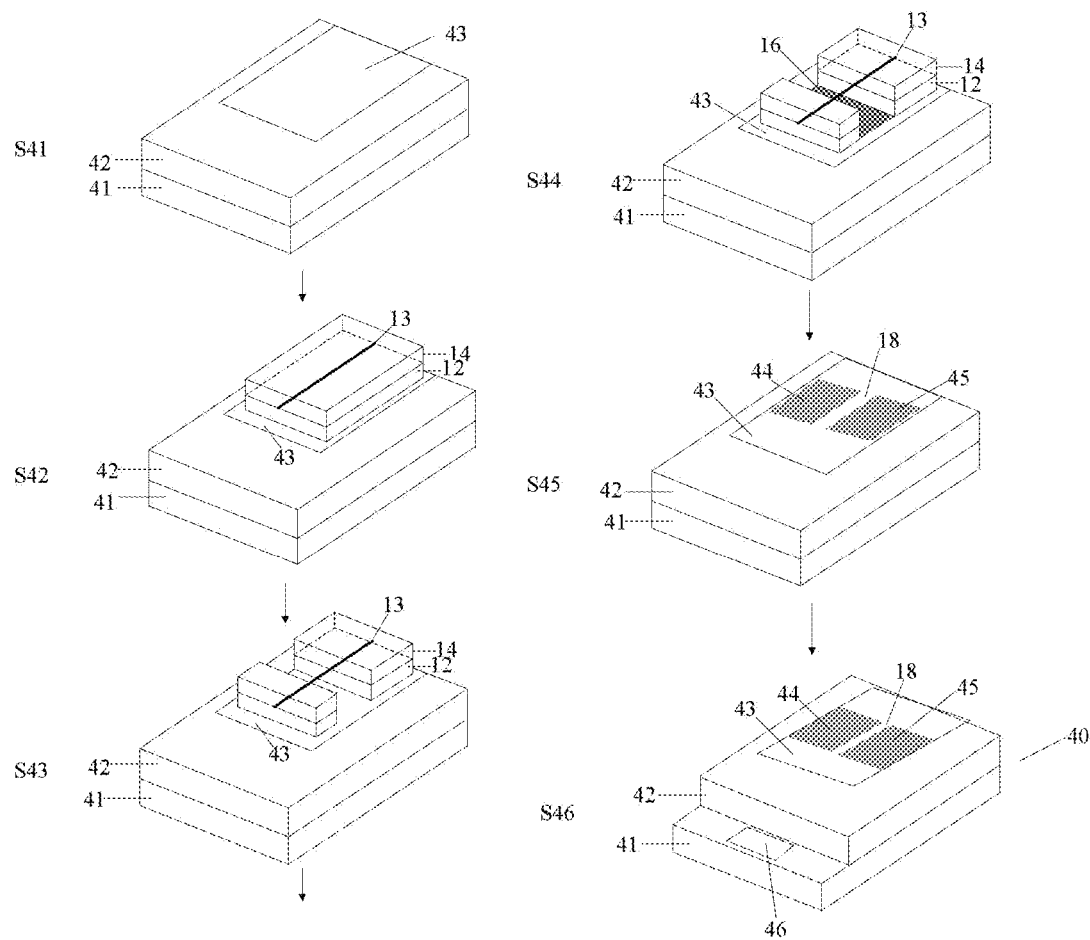
FIG. 13 is a flow chart of one embodiment of a method for making a thin film transistor having nano-scaled channels.

Referring to FIG. 13, an embodiment of a method of making a thin film transistor 40 with nano-scaled channels comprises:

S41, providing an insulating layer 42 on a semiconductor substrate 41, and forming a semiconductor layer 43 on the insulating layer 42;

S42, locating a first photoresist layer 12, a carbon nanotube structure 13, a second photoresist layer 14 on a surface of the semiconductor layer 43, and the carbon nanotube structure 13 being sandwiched between the first photoresist layer 12 and the second photoresist layer 14, wherein the carbon nanotube structure 13 comprises at least one carbon nanotube wire;

S43, forming at least one opening in the first photoresist layer 12 and the second photoresist layer 14 to expose a portion of the surface of the semiconductor layer 43 to form an exposed surface, wherein a part of the carbon nanotube wire is exposed and suspended in the opening, and both ends of the carbon nanotube wire are sandwiched between the first photoresist layer 12 and the second photoresist layer 14;

S44, depositing a conductive film layer 16 on the exposed surface of the semiconductor layer 43 using the carbon nanotube structure 13 as a mask, wherein the conductive film layer 16 defines a nano-scaled channel 18 corresponding to the carbon nanotube wire, and the conductive film layer 16 is divided into two regions by the nano-scaled channel 18, one region is used as a source electrode 44, and the other region is used as a drain electrode 45;

S45, removing the first photoresist layer 12, the carbon nanotube structure 13, and the second photoresist layer 14;

S46, forming a gate electrode 46 on the semiconductor substrate 41, wherein the gate electrode 46 is electrically connected to the semiconductor substrate 41.

The method of making thin film transistor 40 is similar to the method of making thin film transistor 20 except that the gate electrode 46 is located directly on the semiconductor substrate 41 and electrically connected to the semiconductor substrate 41. The voltage between the source electrode 44 and the drain electrode 45 can be regulated by the electrical conduction of the semiconductor substrate 41. The nano-scaled channel 18 and the gate electrode 46 are on the same side of the semiconductor substrate 41, thus, it is not necessary to precisely align the position of the nano-scaled channel 18 and the position of the gate electrode 46. So it is easy to lay the carbon nanotube wires and the method is simple.

The material of the semiconductor substrate 41 can be silicon, gallium arsenide, gallium phosphide, gallium nitride, silicon carbide, or germanium silicide. The semiconductor substrate 41 can act as a support, and the semiconductor substrate 41 can also be used for electrical conduction so that the gate electrode 46 can regulate the source electrode 44 and the drain electrode 45.

The gate electrode 46 is directly located on the semiconductor substrate 41 and electrically connected to the semiconductor substrate 41. Before the preparation of the gate electrode 46, if the insulating layer 42 covers the entire surface of the semiconductor substrate 41, the method can further include removing a part of the insulating layer 42 to expose a part of the surface of the semiconductor substrate 41. Therefore, the gate electrode 46 can be located directly on the surface of the semiconductor substrate 41, and the gate electrode 46 is spaced from the source electrode 44 and the drain electrode 45.

Furthermore, a plurality of source electrodes and drain electrodes can be provided on the surface of the semiconductor layer 43, and the plurality of source electrodes and drain electrodes can be controlled by the gate electrode 46. The position of the gate electrode 46 is adjustable as long as the gate electrode 46 is insulated from the source electrodes and the drain electrodes.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion as to an order for the steps.

What is claimed is:

1. A method of making nano-scaled channel, the method comprising:
   locating a first photoresist layer, a nanowire structure, and a second photoresist layer on a surface of a substrate, and the nanowire structure being sandwiched between the first photoresist layer and the second photoresist layer, wherein the nanowire structure comprises a nanowire;
   forming an opening in the first photoresist layer and the second photoresist layer to expose a portion of the surface of the substrate to form an exposed surface, wherein a part of the nanowire is exposed and suspended in the opening, and both ends of the nanowire are sandwiched between the first photoresist layer and the second photoresist layer; and
   depositing a thin film layer on the exposed surface of the substrate using the nanowire as a mask, wherein the thin film layer defines a nano-scaled channel corresponding to the nanowire.

2. The method as claimed in claim 1, wherein locating the first photoresist layer, the nanowire structure, and the second photoresist layer on the surface of the substrate comprising:
   coating the first photoresist layer on the substrate;
   growing the nanowire structure on a growth substrate;
   transferring the nanowire structure from the growth substrate to the first photoresist layer; and
   coating the second photoresist layer on the nanowire structure.

3. The method as claimed in claim 1, wherein locating the first photoresist layer, the nanowire structure, and the second photoresist layer on the surface of the substrate comprising:
   depositing the first photoresist layer on the substrate;
   growing the nanowire structure on a growth substrate;
   coating the second photoresist layer on the nanowire structure;
   transferring the nanowire structure and the second photoresist layer from the growth substrate to the first photoresist layer.

4. The method as claimed in claim 1, wherein locating the first photoresist layer, the nanowire structure, and the second photoresist layer on the surface of the substrate comprising:
   growing the nanowire structure on a growth substrate;
   coating the first photoresist layer on the nanowire structure;
   transferring the nanowire structure and the first photoresist layer from the growth substrate to the substrate; and
   depositing the second photoresist layer on the nanowire structure.

5. The method as claimed in claim 1, wherein locating the first photoresist layer, the nanowire structure, and the second photoresist layer on the surface of the substrate comprising:
   growing a first nanowire structure unit on a first growth substrate;
   coating the first photoresist layer on a first nanowire structure unit to form a first preform;
   transferring the first preform from the first growth substrate to the substrate;
   growing a second nanowire structure unit on a second growth substrate;
   coating the second photoresist layer on the second nanowire structure unit to form a second preform;
   transferring the second preform from the second growth substrate to the first nanowire structure unit, wherein the first nanowire structure unit and the second nanowire structure unit are in direct contact with each other and form the nanowire structure.

6. The method as claimed in claim 1, wherein the nanowire structure comprises a plurality of nanowires parallel to each other.

7. The method as claimed in claim 1, wherein the nanowire structure comprises a plurality of nanowires intersected with each other to form a network structure.

8. The method as claimed in claim 1, wherein a first thickness of the first photoresist layer is in a range of 50 nanometers to 400 nanometers.

9. The method as claimed in claim 1, wherein a second thickness of the thin film layer is less than a first thickness of the first photoresist layer.

10. The method as claimed in claim 1, wherein forming the opening comprises exposing and removing a portion of the first photoresist layer and the second photoresist layer to form a patterned photoresist layer.

11. The method as claimed in claim 10, further comprises removing the patterned photoresist layer and the nanowire structure.

12. The method as claimed in claim 11, wherein removing the patterned photoresist layer and the nanowire structure comprises placing the patterned photoresist layer in a photoresist removal solution.

13. A method of making nano-scaled channels, the method comprising:
   locating a mask preform on a surface of a substrate, wherein the mask preform comprises a first photoresist layer, a second photoresist layer stacked on the first photoresist layer, and at least one nanowire sandwiched between the first photoresist layer and the second photoresist layer;
   forming at least one opening in the first photoresist layer and the second photoresist layer so that a portion of the surface of the substrate is exposed to form an exposed surface and a part of the at least one nanowire is exposed and suspended in the opening to form a mask; and
   depositing a thin film layer on the exposed surface using the mask, wherein the thin film layer defines at least one nano-scaled channel corresponding to the at least one nanowire.

* * * * *